(12) United States Patent
Yoshida et al.

(10) Patent No.: US 7,038,253 B2
(45) Date of Patent: May 2, 2006

(54) GAN-BASED FIELD EFFECT TRANSISTOR OF A NORMALLY-OFF TYPE

(75) Inventors: Seikoh Yoshida, Chiyoda-ku (JP); Masayuki Sasaki, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/920,203

(22) Filed: Aug. 18, 2004

(65) Prior Publication Data

US 2005/0023555 A1   Feb. 3, 2005

Related U.S. Application Data

(63) Continuation of application No. PCT/JP03/01934, filed on Feb. 21, 2003.

(30) Foreign Application Priority Data

Feb. 21, 2002 (JP) ............................. 2002-044906
Nov. 13, 2002 (JP) ............................. 2002-329223

(51) Int. Cl.
*H01L 31/0328* (2006.01)

(52) U.S. Cl. ............. 257/192; 257/201; 257/189; 257/188; 257/207; 257/194; 257/190; 257/195

(58) Field of Classification Search ............. 257/192, 257/201, 189, 188, 207, 194, 195, 190, 289
See application file for complete search history.

(56) References Cited

U.S. PATENT DOCUMENTS 4,737,827 A   4/1988   Ohta 5,929,467 A   7/1999   Kawai et al.
6,281,528 B1*  8/2001  Wada ........................ 257/200

FOREIGN PATENT DOCUMENTS

| EP | 1134810 A2 | 9/2001 |
|---|---|---|
| JP | 61-234569 | 10/1986 |
| JP | 4-127569 A | 4/1992 |

* cited by examiner

*Primary Examiner*—Minhloan Tran
*Assistant Examiner*—Tan Tran
(74) *Attorney, Agent, or Firm*—Oblon, Spivak, McClelland, Maier & Neustadt, P.C.

(57) ABSTRACT

According to the present invention, there is provided a new GaN-based field effect transistor of a normally-off type, which has an extremely small ON resistance during operation and is capable of a large-current operation. The GaN-based field effect transistor according to the present invention comprises source and drain electrodes; a channel portion made of a first GaN-based semiconducting material that is an i-GaN-based semiconducting material or a p-GaN-based semiconducting material, the channel portion being so formed as to be electrically connected to the source and drain electrodes; first and second electron supply portions made of a second GaN-based semiconducting material having greater bandgap energy than the first GaN-based semiconducting material, the first and second electron supply portions being joined to the channel portion and located separately from each other; an insulating layer formed on the surface of the channel portion, which spreads between the first and second electron supply portions; and a gate electrode disposed on the insulating layer.

14 Claims, 13 Drawing Sheets

GAN-BASED FIELD EFFECT TRANSISTOR OF A NORMALLY-OFF TYPE

TECHNICAL FIELD

The present invention relates to a GaN-based field effect transistor, and more specifically to a new GaN-based field effect transistor of a normally-off type, which has an extremely small ON resistance during operation and is capable of a large-current operation.

BACKGROUND ART

GaN-based semiconducting materials including GaN, InGaN, AlGaN, AlInGaN and the like have greater bandgap energy than GaAs-based materials and the like. Moreover, GaN-based semiconducting materials have a high heat resistance, thereby being excellent in a high-temperature operation. Therefore, development research in various kinds of devices which take advantage of the above-mentioned characteristics of GaN-based semiconducting materials, has been proceeded by using GaN, especially.

An example of a GaN-based HEMT configuration is shown in FIG. 33.

In this HEMT configuration, there is formed on a semi-insulating substrate 91, such as a sapphire substrate, a heterojunction structure in which a buffer layer 92 made of for example GaN, an undoped GaN layer 93, and for example an undoped AlGaN layer 94, which is much thinner than the undoped GaN layer 93, are stacked in that order. On the undoped AlGaN layer 94, there are disposed two n-AlGaN contact layers 95 doped with for example Si of high concentration, which is an n-type impurity. A source electrode S and a drain electrode D are arranged on their respective contact layers 95. Moreover, a gate electrode G is formed onto the undoped AlGaN layer 94 that spreads between the source electrode S and the drain electrode D.

The contact layers 95 are provided for the purpose of upgrading the ohmic junction characteristic between the source(S) and drain(D) electrodes and the semiconductor, so that the contact layers 95 do not have to be provided if ohmic junction can be obtained without them.

FIG. 34 is an enlarged view of a portion $P_1$ encircled by a broken line in FIG. 33 to clearly show the position in which two-dimensional electron gas 96 is produced.

In this HEMT configuration, during the operation of the HEMT, the undoped AlGaN layer 94 functions as an electron supply layer and supplies electrons to the undoped GaN layer 93. Once the source electrode S and the drain electrode D are operated, the electrons supplied to the undoped GaN layer 93 travel through the two-dimensional electron gas 96 to the drain electrode D. Accordingly, the undoped GaN layer 93 serves as a channel layer.

In the case of the above-mentioned HEMT configuration, there generate the two-dimensional electron gas in the whole area of the heterojunction interface expanding from the source electrode S to the drain electrode D. In the HEMT configuration, even if a gate voltage is brought to 0 V to make the gate being off, a pinch-off voltage is not 0 V due to the presence of carriers in the channel layer. Consequently, there is provided a normally-on FET in which drain current keeps flowing.

Therefore, in order to prevent the drain current, it is required that the gate electrode be constantly applied with a gate bias voltage that is equal to or more than a gate threshold value.

In cases where the HEMT configuration is employed as a switching device for a power source, however, it is unfavorable in terms of electricity consumption to keep applying the given voltage to the gate electrode in order to turn the switch off.

Considering the aforementioned, if it is possible to achieve a normally-off FET in which the drain current does not flow at opening the gate with the above-described HEMT configuration, its industrial value is enormous.

An object of the present invention consists in providing a GaN-based FET of a normally-off type, which has a small ON resistance and is capable of a large-current operation.

DISCLOSURE OF THE INVENTION

To accomplish the above-mentioned object, the present invention provides a GaN-based field effect transistor comprising source and drain electrodes; a channel portion made of a first GaN-based semiconducting material that is an i-GaN-based semiconducting material or a p-GaN-based semiconducting material and formed so as to be electrically connected to the source and drain electrodes; first and second electron supply portions made of a second GaN-based semiconducting material having greater bandgap energy than the first GaN-based semiconducting material, joined to the channel portion, and located separately from each other; an insulating layer formed on a surface of the channel portion, which spreads between the first and second electron supply portions; and a gate electrode arranged on the insulating layer.

Specifically, there is provided a GaN-based field effect transistor (hereinafter referred to as "type A") in which the channel portion is a channel layer overlaid on an upper surface of a substrate, the source and drain electrodes are both arranged on a surface of the channel layer, and the first and second electron supply portions are disposed between the source electrode and the drain electrode on the surface of the channel layer.

Furthermore, there is provided a GaN-based field effect transistor (hereinafter referred to as "type B") according to claim 1, in which the channel portion is formed into a ridge, the source electrode and the drain electrode are formed on an upper surface and lower surface of the ridge-shaped channel portion, respectively, and the electron supply layers and the insulating layer are formed on a side wall surface of the channel portion.

BEST MODE OF CARRYING OUT THE INVENTION

Figure 1:
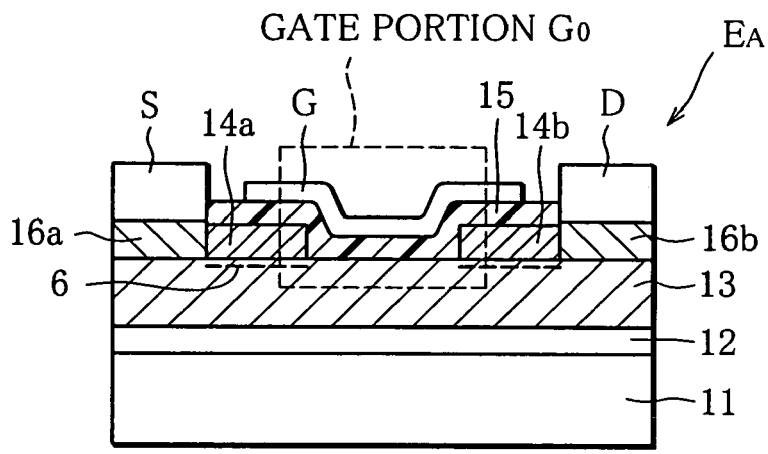
FIG. 1 is a cross-section showing a first embodiment of a GaN-based FET according to the present invention of type A.

FIG. 1 shows a cross-sectional configuration of a first embodiment $E_A$ of a GaN-based FET according to the present invention of type A.

In the GaN-based FET ($E_A$), a buffer layer 12 made of for example GaN and a channel layer 13 made of a first GaN-based semiconducting material that is an i-GaN-based semiconducting material or a p-GaN-based semiconducting material are stacked on a semi-insulating substrate 11 in the order named.

On the channel layer 13, a first electron supply layer 14a and a second electron supply layer 14b, which are made of a second GaN-based semiconducting material having greater bandgap energy than a first GaN-based semiconducting material that is a material for the channel layer 13, are located separately from each other.

A surface of the channel layer 13, which shows from between the first and second electron supply layers 14a, 14b, is covered with an insulating layer 15. On the insulating layer 15, a gate electrode G is formed out of for example Ta—Si. Consequently, a gate portion $G_0$ indicated by a broken line of FIG. 1 is constructed.

On both sides of the gate portion $G_0$, there is disposed a pair of contact layers 16a, 16b made of for example n-GaN that is doped with an n-type impurity, such as Si, of high concentration of $5 \times 10^{17}$ cm$^{-3}$ or more. A source electrode S and a drain electrode D are arranged on the contact layers 16a and 16b, respectively.

The FET of type A is designed to include the electron supply layers aligned in a horizontal direction. In the FET of type A, the source and drain electrodes are both formed on the same side (surface) of the channel layer 13.

The first electron supply layer 14a and the second electron layer 14b are joined to the channel portion 13 so as to be arranged separately from each other.

Herein, the second GaN-based semiconducting material making up the electron supply layers 14a, 14b has greater bandgap energy than the first GaN-based semiconducting material making up the channel layer 13. Since the channel layer 13 and the electron supply layers 14a, 14b are formed to each other through heterojunction, two-dimensional electron gases 6 are generated in the channel layer 13 in the vicinity of a junction interface right under the electron supply layers 14a, 14b.

The first GaN-based semiconducting material used in the present invention is an i-GaN-based semiconducting material or a p-GaN-based semiconducting material. The p-GaN-based semiconducting material is obtained by doping a GaN-based semiconducting material with a p-type impurity, such as Mg, C, and Zn. The second GaN-based semiconducting material has greater bandgap energy than the first GaN-based semiconducting material. Examples of the first and the second GaN-based semiconducting material include the following materials.

Where the first GaN-based semiconducting material making up the channel layer is $M_A$, and the second GaN-based semiconducting material making up the electron supply layers is $M_B$, and a combination of $M_A$ and $M_B$ is expressed by $M_A/M_B$, a preferable combination is p-GaN/AlGaN, p-GaN/AlInGaN, p-InGaN/GaN, p-GaNAs/GaN, p-GaIn-NAsP/GaN, p-GaInNP/GaN, p-GaNP/GaN, p-GaN/AlGaIn-NAsP or p-AlInGaN/AlGaN.

In the gate portion $G_o$, there is no electron supply layer under the gate electrode G. Under the gate electrode G, an insulating layer 15 is so formed as to cover a partial surface of the channel layer 13 and parts of the first and second electron supply layers 14a, 14b.

Therefore, two-dimensional electron gases are not generated right under the gate electrode, that is, in the channel layer 13 that spreads between the electron supply layers 14a and 14b.

In the case of the FET($E_A$), the two-dimensional electron gas generated in the channel layer 13 is not continuous but discontinued at a position right under the gate electrode G. The two-dimensional electron gases 6 are generated only in the channel layer 13 right under the pair of electron supply layers 14a, 14b.

As a material for the insulating layer 15, for example, $SiO_2$, AlN, $Al_2O_3$, $Ga_2O_3$, $TaO_2$, $SiN_X$ or SiON can be used.

The GaN-based FET ($E_A$) has operations and advantages described below.

Figure 2:
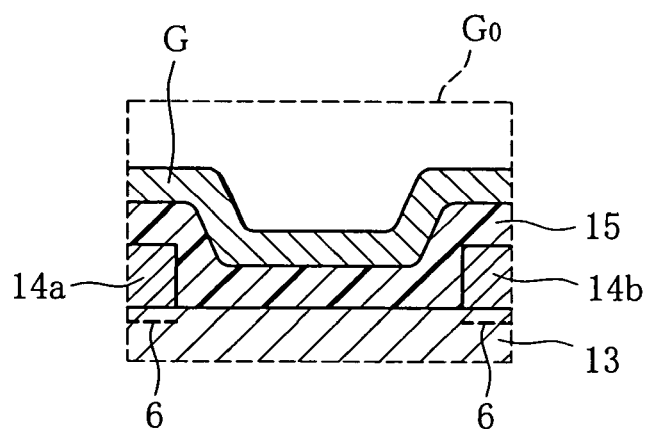
FIG. 2 is a partial enlarged view of FIG. 1.

In the FET ($E_A$), the two-dimensional electron gases 6 are generated in the channel layer 13 in the heterojunction interface between the channel layer 13 and the electron supply layers 14a, 14b. However, the two-dimensional electron gas is not generated in the region of the channel layer 13, in which the insulating layer 15 is formed instead of the electron supply layers 14a, 14b. In other words, the spread of the two-dimensional electron gases 6 produced in the channel layer 13 is discontinued at the place where the insulating layer 15 is formed. This state is illustrated in FIG. 2 that is an enlarged view of the gate $G_0$ of FIG. 1.

For that reason, in the GaN-based FET ($E_A$), a drain current that flows in the channel layer 13 is suppressed at opening the gate, thereby reducing pinch-off voltage.

If bias voltage of a given value is applied to the gate electrode G, however, there generates a population inversion layer of electrons in the region of the channel layer 13, which is located right under the insulating layer 15. As a result, the two-dimensional electron gases 6, which have been discontinued from each other before the application of the voltage, are connected to each other with the population inversion layer therebetween, so that the FET ($E_A$) exhibits an FET operation.

That is, the GaN-based FET ($E_A$) acts as a normally-off FET. A large-current operation can be more easily achieved by using a material having bandgap energy that is smaller than or equal to bandgap energy of the first semiconducting material used for the channel layer 13, as a semiconducting material forming the contact layers 16a, 16b. This is because the use of such a material increases retrieving efficiency of carriers of the contact layer 16b. Such materials include GaN, InGaN, GaNAs, GaInNAsP, GaInNP, GaNP, and AlInGaN.

The GaN-based FET ($E_A$) can be fabricated in the following manner.

Figure 3:
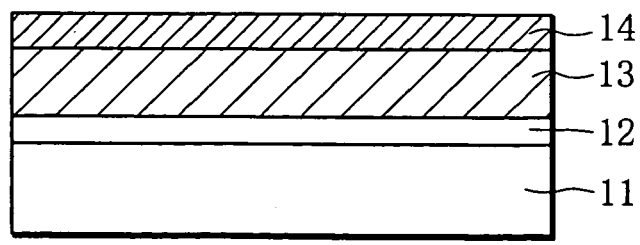
FIG. 3 is a cross-section showing a first step in fabrication of the GaN-based FET of FIG. 1.

First, as shown in FIG. 3, there are formed on the semi-insulating substrate 11 a buffer layer 12 made of for example GaN, the channel layer 13 made of for example p-GaN, and the electron supply layer 14 made of for example undoped AlGaN in the order named, through an epitaxial crystal growth method, such as a gas source molecular beam epitaxial (GSMBE) method and a metal-organic chemical vapor deposition method (MOCVD).

Although sapphire is generally used as a material for the substrate 11, the material can be SiC, GaAs, Si, GaN or the like. The p-type impurity used for making the channel layer 13 can be Mg, Zn, C or the like. A carrier concentration in this occasion is preferably in the range of from about $1\times10^{19}$ to about $5\times10^{16}$ cm$^{-3}$.

Figure 4:
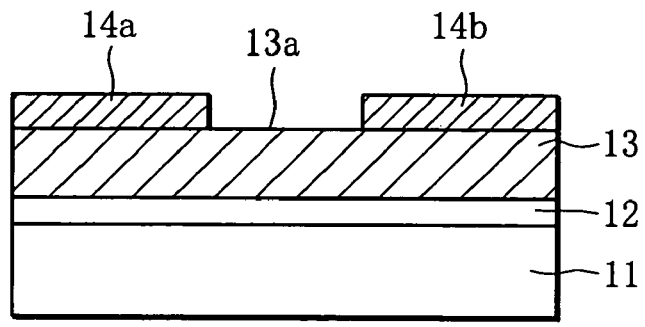
FIG. 4 is a cross-section showing a second step in the fabrication of the GaN-based FET of FIG. 1.

Subsequently, the electron supply layer 14 is etch-removed down to the channel layer 13 in a region corresponding to the gate portion $G_0$ to be formed, by using plasma of a mixed gas of for example $CH_3/H_2/Ar$. By so doing, as illustrated in FIG. 4, there are separately formed the first electron supply layer 14a and the second electron supply layer 14b, and a surface 13a of the region of the channel layer 13, which corresponds to the gate portion $G_0$, is exposed.

Figure 5:
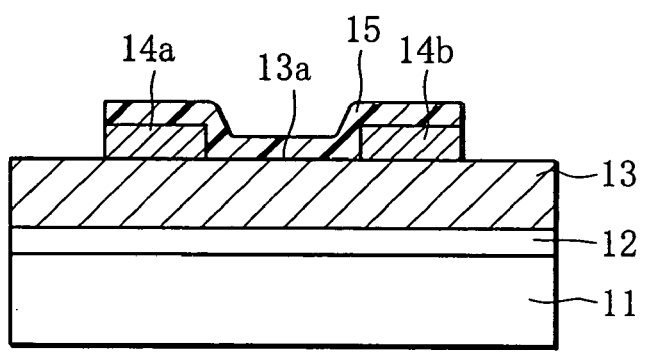
FIG. 5 is a cross-section showing a third step in the fabrication of the GaN-based FET of FIG. 1.

Next, a $SiO_2$ film is formed across the entire surface for example by a heat CVD method. Then, the $SiO_2$ film is etch-removed in regions where the source and drain electrodes are to be formed, and moreover the electron supply layer 14 thereunder is etch-removed, thereby forming an insulating layer ($SiO_2$ film) 15 that covers the pair of the electron supply layers 14a, 14b and the surface 13a of the channel layer 13 as illustrated in FIG. 5.

Figure 6:
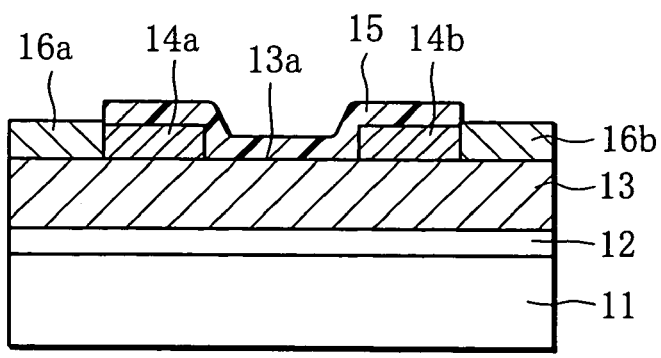
FIG. 6 is a cross-section showing a fourth step in the fabrication of the GaN-based FET of FIG. 1.

Subsequently, a surface of the insulating layer 15 is subjected to masking, and the contact layers 16a, 16b are then formed in positions of the channel layer 13, in which the source and drain electrodes are to be disposed as illustrated in FIG. 6, by using n-GaN doped with an n-type impurity, such as Si, of high concentration through the GSMBE method or the MOCVD method.

As the n-type impurity for making n-GaN of the contact layers 16a, 16b, Te, S or the like can be used instead of Si. Moreover, a reduction in bandgap energy facilitates an electrical contact, so that GaN-based mixed crystal containing P, As, Sb or In can be used. Doping concentration is preferably as high as $1\times10^{19}$ cm$^{-3}$ or more because it develops the retrieving efficiency of carriers of the channel layer, which makes it easy to achieve the large-current operation.

Thereafter, the gate electrode G is disposed on the insulating layer 15, and the source electrode S and the drain electrode D are formed on the contact layers 16a and 16b, respectively, through the common procedure, thereby obtaining the GaN-based FET ($E_A$) shown in FIG. 1.

Materials used for forming the source and drain electrodes can be metal silicides, such as Ta—Si and W—Si, and a metal silicide with a surface onto which Au is evaporated or Al and Ti are evaporated in order or Ti and Au are evaporated in order. A material for the gate electrode can be one onto which Pt and Au or Pd and Au or Ni and Au or Pt, Ni and Au or W and Au are evaporated in order.

In the GaN-based FET ($E_A$), an area of the heterojunction interface between the electron supply layers 14a, 14b and the channel layer 13 and a contact area between the insulating layer 15 and the surface 13a of the channel layer are so designed to have proper values in view of a relation between a target operating current value and the population inversion layer that is generated under the insulating layer 15.

Figure 7:
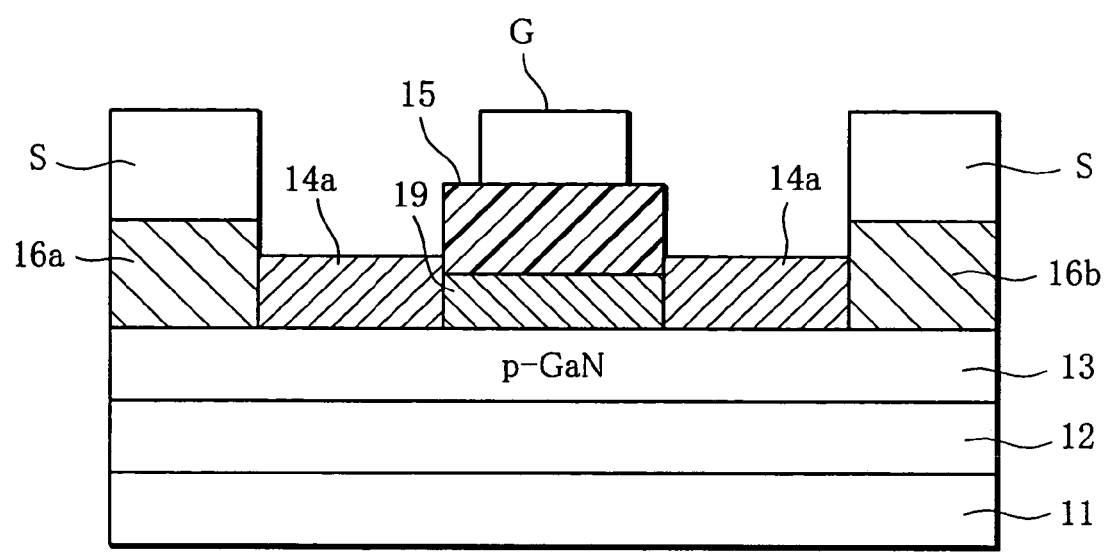
FIG. 7 is a cross-section showing a first modification of the embodiment of FIG. 1.

In case that the aforementioned GaN-based FET is actually fabricated, it is preferable, as illustrated in FIG. 7, to form in between the insulating layer 15 and the channel layer 13 a layer 19 made of a GaN-based semiconducting material ($Al_{0.05}Ga_{0.95}N$) having greater bandgap energy than the GaN-based semiconducting material (p-GaN in the drawing) making up the channel layer 13, having bandgap energy equal to or smaller than the GaN-based semiconducting material ($Al_{0.2}Ga_{0.8}N$) forming the adjacent electron supply layers 14a, 14b and at the same time greater than the channel layer 13. Such a configuration as well as the above-described embodiment makes a normally-off FET.

Figure 8:
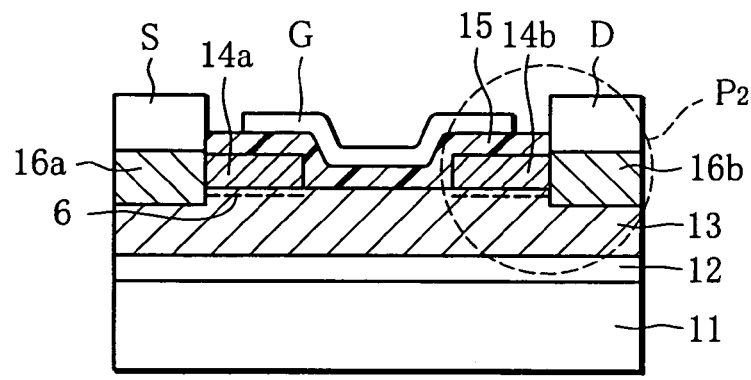
FIG. 8 is a cross-section showing a second modification of the embodiment of FIG. 1.
Figure 9:
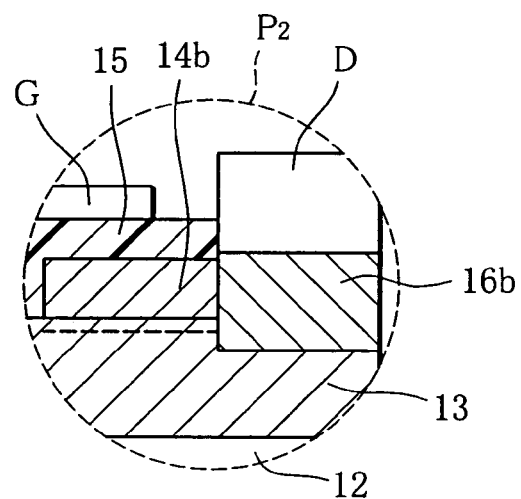
FIG. 9 is a partial enlarged view of FIG. 8.

In the GaN-based FET ($E_A$), the contact layers 16a, 16b are directly disposed on the surface of the flat channel layer 13. In the step shown in FIG. 5, however, it is preferable that after etching the channel layer 13 down to a certain depth, the contact layers 16a, 16b be formed in the etched regions, and that a part of each of the contact layers 16a, 16b be embedded in the channel layer 13 as illustrated in FIG. 8. FIG. 9 which is an enlarged view of a region $P_2$ encircled by a broken line of FIG. 8 shows a positional relation between the contact layers 16a, 16b, the parts of which are embedded in the channel layer 13, and the respective two-dimensional electron gases 6.

According to the GaN-based FET, the contact layers 16a, 16b, the parts of which are embedded in the channel layer 13, are directly connected to end portions of the two-dimensional electron gases, which makes the retrieving efficiency of carriers higher and achieves the large-current operation without difficulty.

Figure 10:
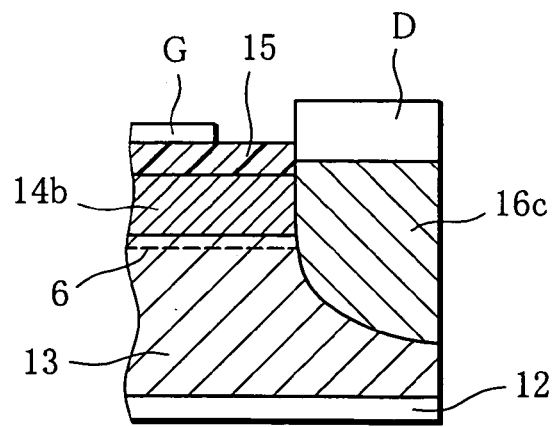
FIG. 10 is a cross-section showing a third modification of the embodiment of FIG. 1.

FIG. 10 shows another embodiment of a contact layer. In the case of this embodiment, an embedded part of a contact layer 16c is formed into a curved surface. If the embedded part of the contact layer 16c is formed into the curved surface, the embedded part is directly connected to the two-dimensional electron gas 6 as a matter of course, and moreover the curved surface prevents the focusing of electric field from occurring at the time of voltage application to the gate electrode G, thereby increasing pressure resistance of the FET.

Figure 11:
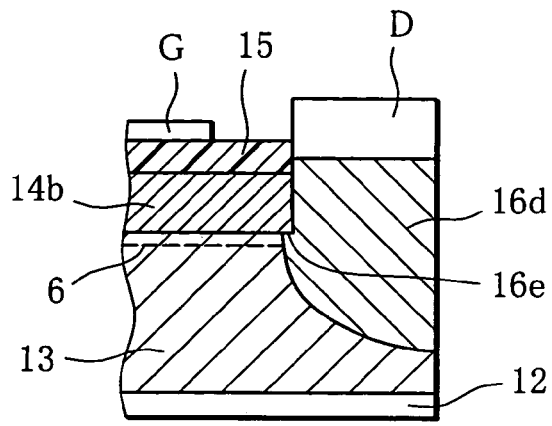
FIG. 11 is a cross-section showing a fourth modification of the embodiment of FIG. 1.

FIG. 11 shows further another embodiment of a contact layer. In the case of the FET, the embedded part of a contact layer 16d is so embedded as to penetrate a part of the junction interface between the channel layer 13 and the electron supply layer 14b to form an undercut portion 16e. The undercut portion 16e is formed into a curved surface. Even if there is a discontinuity (that makes the two-dimensional electron gas generation insufficient) in the interface between the electron supply layer 14b and the contact layer 16d, forming the undercut portion 16e enables the contact layer 16d to receive electron gas surely in a place short of such an interface, where an electron gas layer is generated. This enhances the retrieving efficiency of electrons.

In case that the contact layer having the shape of a curved surface is formed and that the undercut portion is provided, at etching the channel layer shown in FIG. 7, kinds of an etchant, etching conditions and the like are properly selected, and the channel layer is formed into a desired shape to arrange the contact layer thereon.

Figure 12:
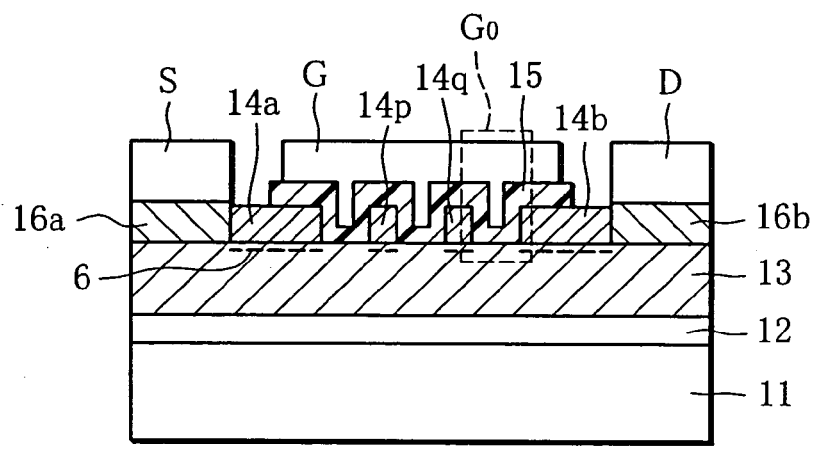
FIG. 12 is a cross-section showing a second embodiment of the GaN-based FET according to the present invention of type A.

FIG. 12 shows a second embodiment $E_{B1}$ of the GaN-based FET according to the present invention of type A. The FET ($E_{B2}$) is a GaN-based field effect transistor in which a plurality of gate portions $G_0$ are arranged on the same substrate.

In the GaN-based FET ($E_{B1}$), there are a plurality (three in the drawing) of discontinuities in the electron supply layer down to the surface of the channel layer 13, which makes four electron supply layers 14a, 14p, 14q and 14b. Among the layers, one that is electrically connected to the source electrode is the electron supply layer 14a, and one that is electrically connected to the drain electrode is the electron supply layer 14b. There are discontinuities between the electron supply layers 14a and 14p, between the electron supply layers 14p and 14q, and between the electron supply layers 14q and 14b, whereby the surfaces of the channel layer 13 are exposed therefrom. The insulating layer 15 is formed on the showing surfaces of the channel layer, and a common gate electrode G is arranged thereon. That is, there are three gate portions $G_0$ formed on the same substrate.

In the case of the GaN-based FET ($E_{B1}$), there is formed the two-dimensional electron gas 6, spread of which is discontinued at three places of heterojunction interfaces between the four electron supply layers and the channel layer 13.

If a large number of electron supply layers are so arranged that distance between two adjacent electron supply layers is for example as short as 100 nm or less, an effective gate length is shortened since the gate portions $G_0$ in the GaN-based FET ($E_{B1}$) forms a configuration in which gate electrodes, which are each formed in a microscopic groove portion between two adjacent electron supply layers, are integulated together. As a result, it is possible to achieve pinch-off by gate bias voltage that is smaller than for example the GaN-based FET ($E_A$) of FIG. 1.

Figure 13:
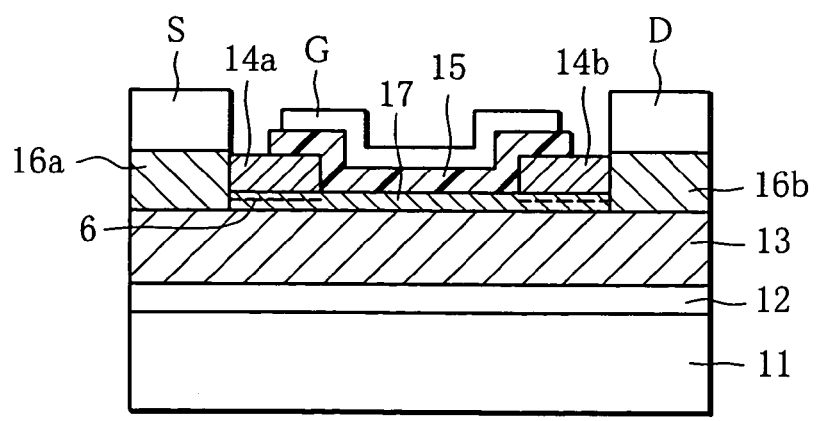
FIG. 13 is a cross-section showing a third embodiment of the GaN-based FET according to the present invention of type A.

FIG. 13 shows a third embodiment $E_{B2}$ of the GaN-based FET according to the present invention of type A.

In the GaN-based FET ($E_{B2}$), an undoped GaN-based semiconductor layer 17, such as i-type GaN, is formed on the channel layer 13 made of the first GaN-based semiconducting material that is p-GaN, the undoped GaN-based semiconductor layer 17 having a high degree of purity and being ultrathin (for example 10 nm or less). On the layer 17, the first and second electron supply layers 14a, 14b, the insulating layer 15, and the gate electrode G are provided.

In this embodiment, the two-dimensional electron gases 6 are generated in regions of the layer 17, which are located right under the first and second electron supply layers 14a, 14b. At the time of operation of the gate electrode G, there generates a population inversion layer of electrons in the layer 17 to carry out FET operation.

The embodiment has such a configuration in order to eliminate fear that if the channel layer is p-GaN, there should generate compensation in relation to the generated electrons, resulting in a reduction of the retrieving efficiency of carriers.

Figure 14:
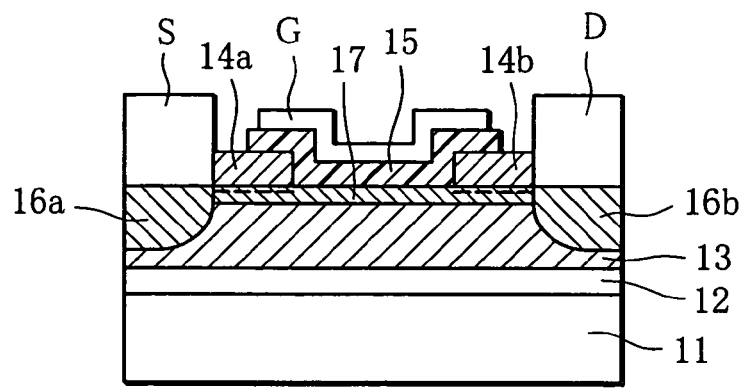
FIG. 14 is a cross-section showing a first modification of the embodiment of FIG. 13.

In this case, the large-current operation can be more easily achieved as stated above by embedding parts of the contact layers 16a, 16b of FIG. 13 in the channel layer 13 and forming interfaces between the contact layers and the channel layer into curved surfaces as illustrated in FIG. 14.

Figure 15:
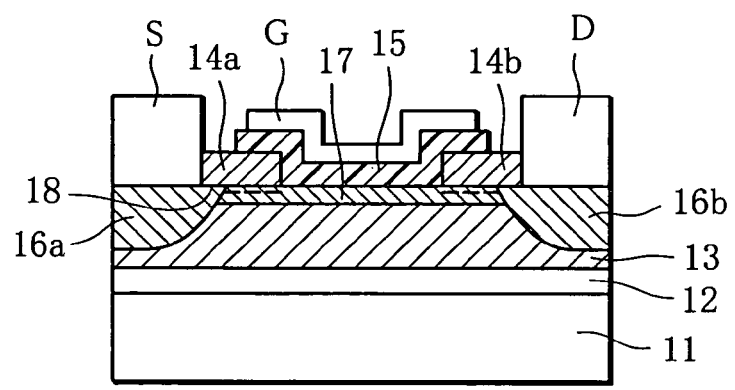
FIG. 15 is a cross-section showing a second modification of the embodiment of FIG. 13.

As illustrated in FIG. 15, it is possible to make a resistance value small by forming undercuts 18 under the layer 17.

Figure 16:
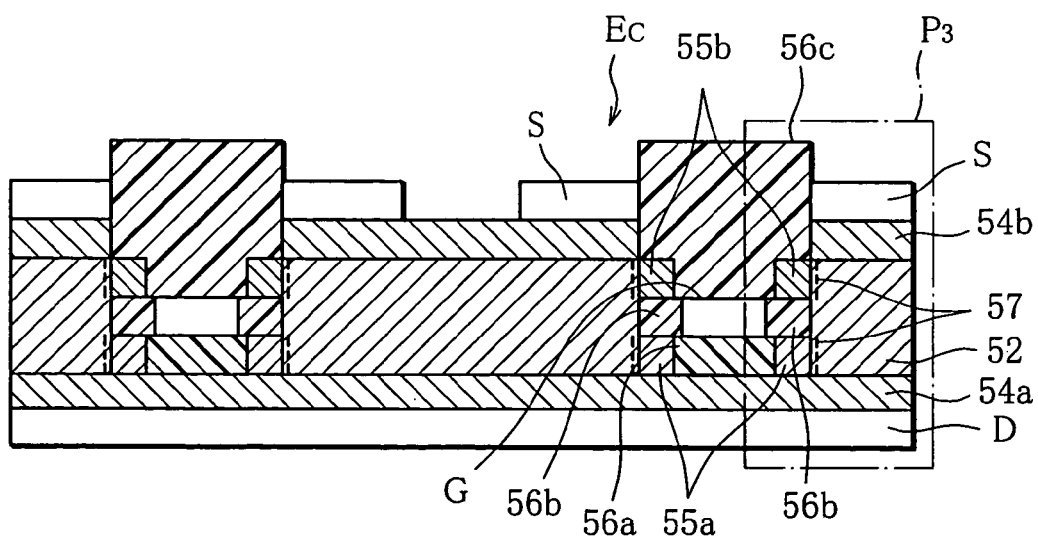
FIG. 16 is a cross-section showing a first embodiment of a GaN-based FET according to the present invention of type B.

A GaN-based FET according to the present invention of type B will be described below. FIG. 16 shows one embodiment $E_C$ of the GaN-based FET of type B.

The GaN-based FET ($E_C$) according to type B has channel portions 52 including grooves 53 aligned in two lines and being made of a GaN-based semiconducting material. Contact layers 54 are formed in three lines on upper surfaces of the channel portions 52, except for the grooves 53. On the contact layers 54, there are arranged four source electrodes S so as to align with edges of the two grooves 53. A drain electrode D is located on a lower surface of the channel portion 52.

The FET of type B includes first and second electron supply layers aligned in a vertical direction. In the FET of type B, the source and drain electrodes are formed to the upper and lower surfaces of ridge-shaped channel portions 52 with contact layers 54b and 54a therebetween, respectively. There are also formed electron supply layers 55a, 55b and insulating layers 56b on side surfaces of the channel portion 52.

At a bottom of the groove 53, two electron supply layers 55a are so formed as to be attached to side surfaces of the groove 53, the two electron supply layers 55a being separated from each other by an insulating layer 56a. The electron supply layers 55a are made of a GaN-based semiconducting material having greater bandgap energy than the GaN-based semiconducting material making up the channel portion 52.

When the two electron supply layers 55a and the insulating layer 56a forms a first tier, a gate electrode G is located on the insulating layer 56a as a second tier. The gate electrode G is sandwiched at sides thereof between the insulating layers 56b and is not in contact with the side surfaces of the groove 53.

Located on the two insulating layers 56b are the electron supply layers 55b that play the same role as those located in the first tier. A material forming the electron supply layers 55b is identical to the one making up the electron supply layers 55a. That is, in the embodiment, the electron supply layers 55a and 55b act in the vertical direction, and two-dimensional electron gases 57 running in the vertical direction are generated in heterojunction interfaces of the channel portions 52, which contact the electron supply layers 55a and 55b.

An insulating layer 56c is overlaid on the gate electrode G (that is also the side portions of the two electron supply layers 55b at the same time).

The contact layer 54b provided on the upper surface of the channel portion 52 is so disposed as to contact the electron supply layer 55b at a corner thereof. The contact layer 54a provided on the lower surface of the channel portion 52 is so disposed as to contact the electron supply layer 55a at a corner thereof. This is to cause the flow of electrons from the source electrode to reach the two-dimensional gas layers.

If ohmic junction of the metal material making up the source and drain electrodes S and D can be performed with respect to the channel portions 52 and the electron supply layers 55b, 55a, the source electrodes S can be formed directly on the upper surfaces of the channel portions 52, and the drain electrode D can be formed directly on the lower surfaces of the channel portions 52, without forming the contact layers 54b, 54a. In this case, to maintain the electron flow from the source electrodes S to the two-dimensional electron gases, the source electrodes S and the drain electrode D formed directly on the channel portions 52 have to be attached to the electron supply layers 55b and 55a, respectively, at least on edge lines, preferably on surfaces.

In the GaN-based FET ($E_C$), a vertical normally-off FEMT is achieved, and in addition the aforementioned four normally-off HEMTs are included in a compact configuration. Specifically, in the case of the GaN-based FET ($E_C$), a space required in one HEMT configuration can be formed smaller than a conventional one in which the source and drain electrodes and the gate electrode are arranged on the same surface of the channel portion. This is because in the GaN-based FET ($E_C$), the source and drain electrodes and the gate electrode on the channel portion are arranged on different surfaces (the gate electrode is disposed through the insulating layer). Therefore, the HEMT according to the GaN-based FET ($E_C$) can be minimized, compared to a conventional HEMT.

Figure 17:
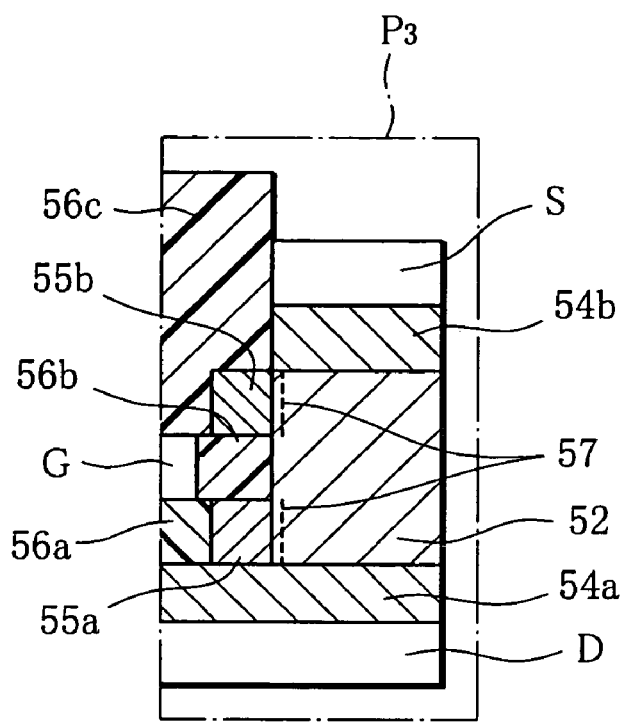
FIG. 17 is a partial enlarged view of FIG. 16.

FIG. 17 is an enlarged view of a region surrounded by a dashed line $P_3$ of FIG. 16 to more clearly show a configuration of one of the normally-off HEMTs in the GaN-based FET ($E_C$). As illustrated in FIG. 17, the two-dimensional electron gases 57 spread in the vertical direction from the upper surface of the channel portion 52 toward the lower surface thereof. The electron gas layer is discontinued at the place where the insulating layer 56b between the electron supply layers 55a and 55b is located.

Herein, it is preferable that the electron supply layers 55a, 55b each have a thickness of about 20 to 30 nm since this makes it possible to form the two-dimensional gas of high concentration, which has a carrier concentration of $5 \times 10^{18}$ to $5 \times 10^{19}$ cm$^{-3}$, in a place that is 1–2 nm away from the heterojunction interface.

The gate electrode G is located in a side portion of the insulating layer 56b, so that application of a gate bias produces population inversion of electrons during the operation of the HEMT, whereby the electron flow which has been discontinued is proceeded.

Figure 18:
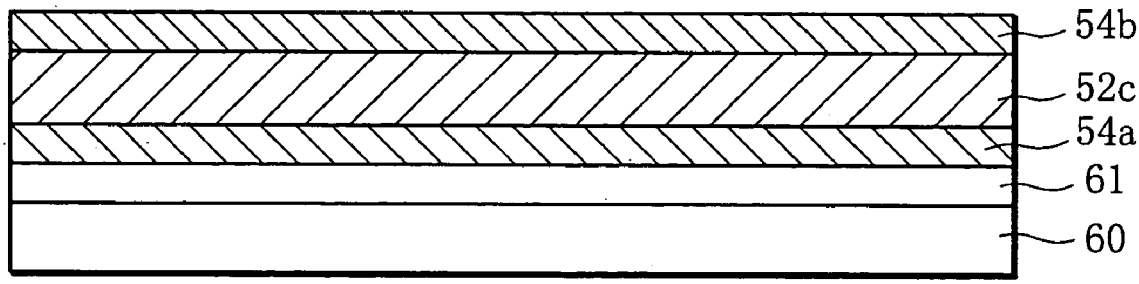
FIG. 18 is a cross-section showing a first step in fabrication of the GaN-based FET of FIG. 16.

The GaN-based FET ($E_C$) can be fabricated through a procedure shown in FIGS. 18 through 31. As illustrated in FIG. 18, a substrate for growth 60, such as a semi-insulating Si substrate, is first prepared. On the substrate, a buffer layer 61 made of GaN, a contact layer 54a made of GaN doped with, for example, Si of a high concentration of $5 \times 10^{17}$ cm$^{-3}$ or more, a channel layer 52c made of a GaN-based semiconducting material, such as p-GaN, and a contact layer 54b made of the same material as the contact layer 54a are stacked in the order named, through an epitaxial crystal growth method, such as the GSMBE method and the MOCVD method. As stated above, in case that a contact layer is provided, the bandgap energy of the contact layer has to be smaller than or equal to that of the channel layer.

It is also possible to use SiC, GaAs, GaN, sapphire or the like as a material for the substrate for growth 60. The channel layer 52c is formed into a channel layer 52 through the following steps.

Figure 19:
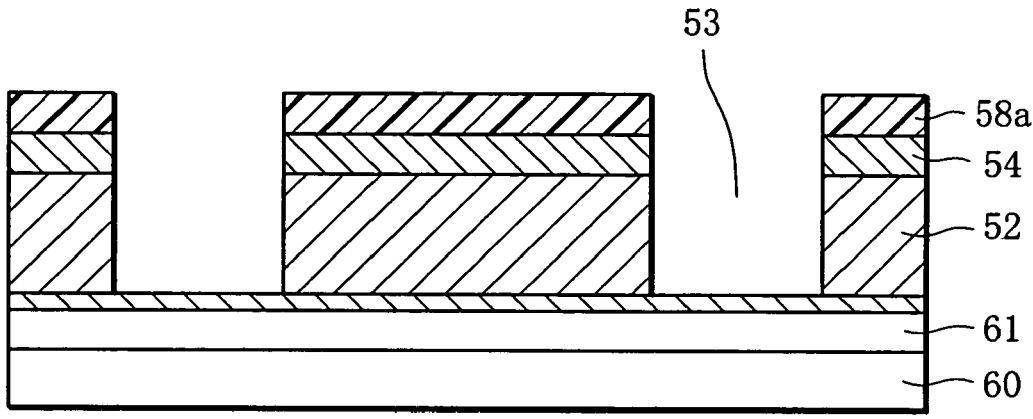
FIG. 19 is a cross-section showing a second step in the fabrication of the GaN-based FET of FIG. 16.

As illustrated in FIG. 19, a mask 58a made of SiO$_2$ is patterned on a surface of the channel layer 52c, and subsequently parts of the contact layer 54b and the channel layer 52c are subjected to a dry etching process until the contact layer 54a is exposed, by using for example ECR (electron cyclotron resonance) plasma to define a groove 53.

Figure 20:
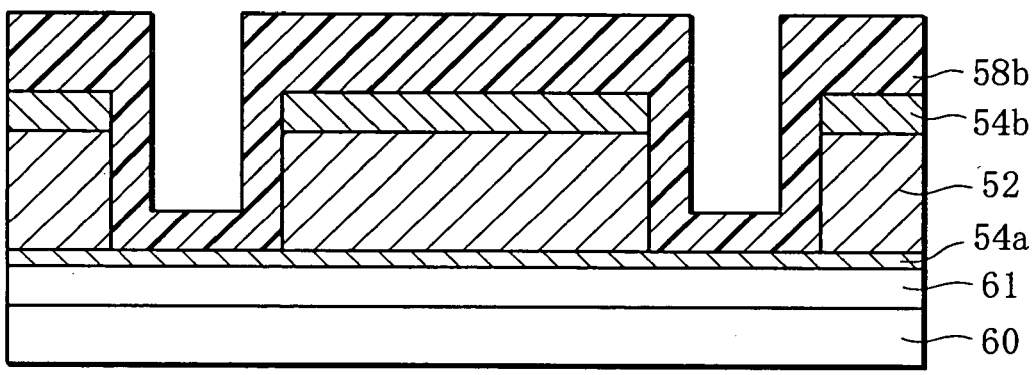
FIG. 20 is a cross-section showing a third step in the fabrication of the GaN-based FET of FIG. 16.

As illustrated in FIG. 20, a mask 58b made of SiO$_2$ is deposited on the entire surface. As a material for the mask 58b, Al$_2$O$_3$ or SiN$_X$ having chemical and thermal stability can be utilized.

Figure 21:
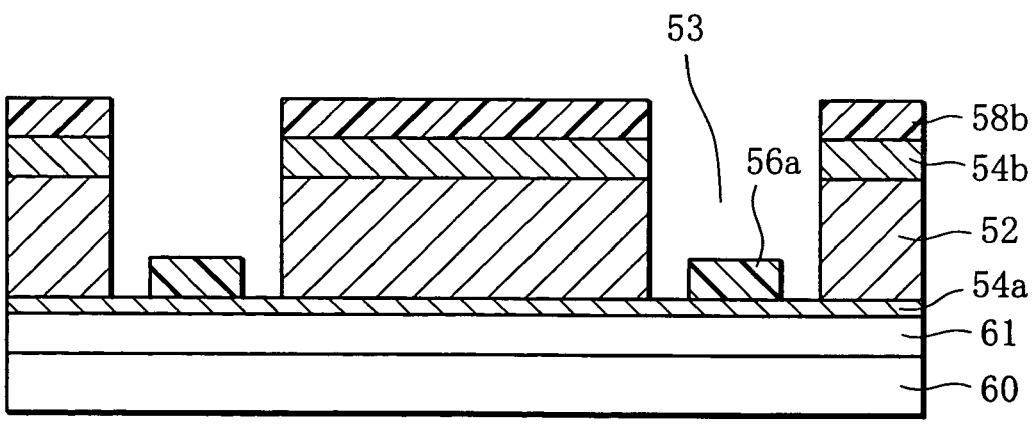
FIG. 21 is a cross-section showing a fourth step in the fabrication of the GaN-based FET of FIG. 16.

Next, as illustrated in FIG. 21, the mask 58b is patterned to be partially removed, thereby forming an insulating layer 56a at the bottom of the groove 53 away from side walls of the groove 53.

Figure 22:
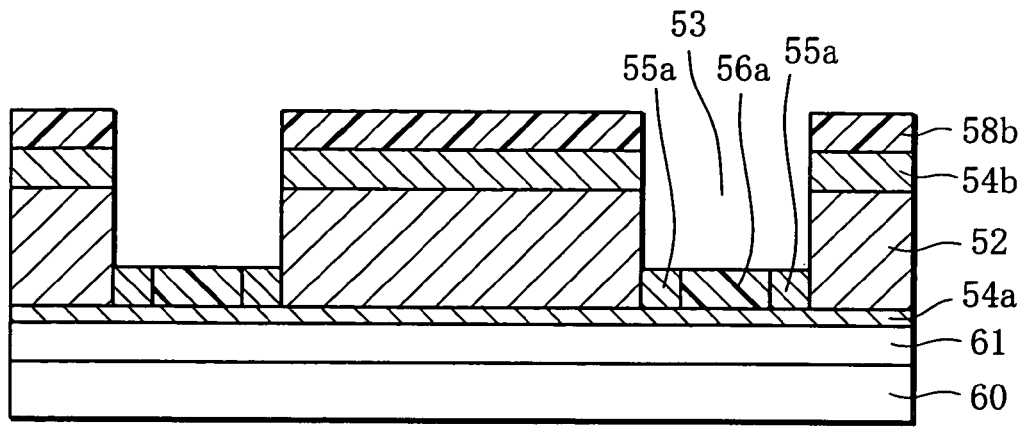
FIG. 22 is a cross-section showing a fifth step in the fabrication of the GaN-based FET of FIG. 16.

As illustrated in FIG. 22, AlGaN having greater bandgap energy than p-GaN making up the channel portion 52 is deposited by epitaxial growth on regions other than those covered with the insulating layer 56a and 58b, that is, in regions on which the insulating layer 56a is not disposed at the bottom of the groove 53, to thereby form an electron supply layer 55a.

Figure 23:
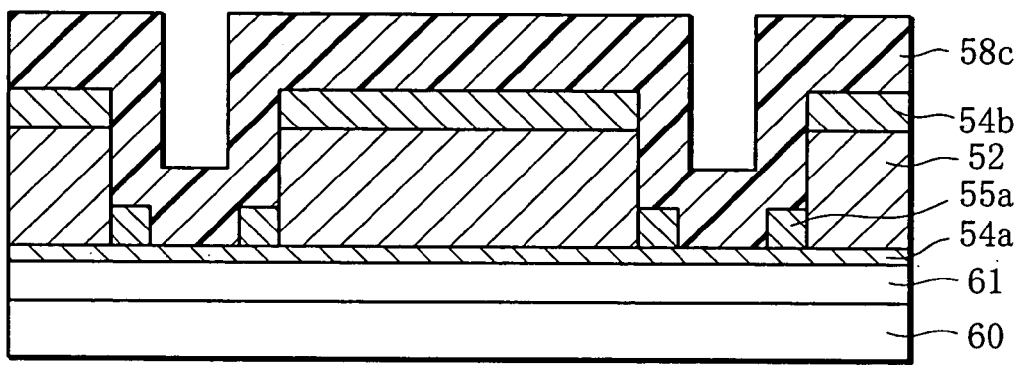
FIG. 23 is a cross-section showing a sixth step in the fabrication of the GaN-based FET of FIG. 16.

Thereafter, as illustrated in FIG. 23, a mask 58c made of SiO$_2$ is deposited on the entire surface.

Figure 24:
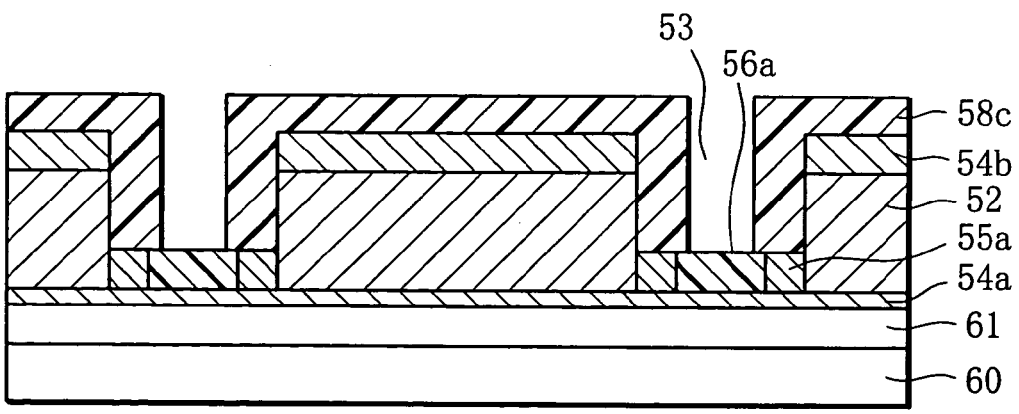
FIG. 24 is a cross-section showing a seventh step in the fabrication of the GaN-based FET of FIG. 16.

Subsequently, as illustrated in FIG. 24, the entire surface of the mask 58c is etched down till the insulating layer 56a formed in the step of FIG. 21 shows again. Thus, the electron supply layer 55a is surmounted by the insulating mask 58c, and the side wall of the channel portion 52 is covered, except for a region upon which the electron supply layer 55a abuts.

Figure 25:
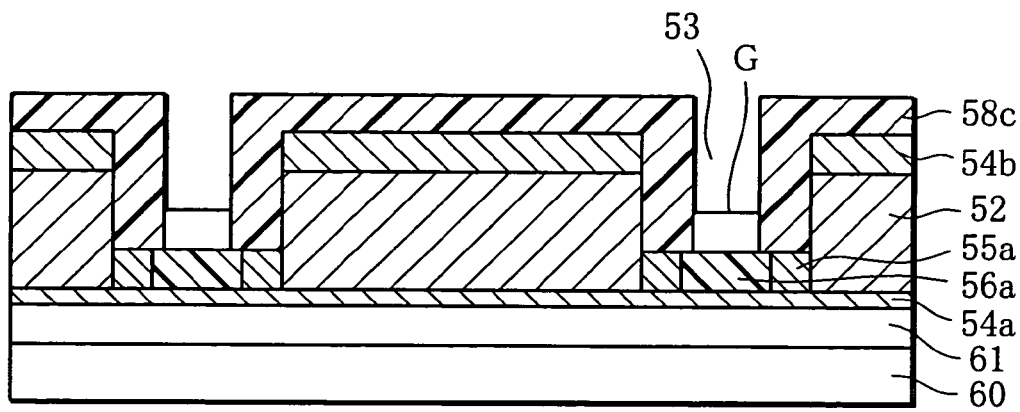
FIG. 25 is a cross-section showing an eighth step in the fabrication of the GaN-based FET of FIG. 16.

Masking is then provided onto the resultant layers, except for the grooves 53, and Pt as a gate electrode material is evaporated to have thickness smaller than the depth of the channel portion 52 excluding the thickness of the insulating layer 56a, to thereby form a gate electrode G, as illustrated in FIG. 25.

Figure 26:
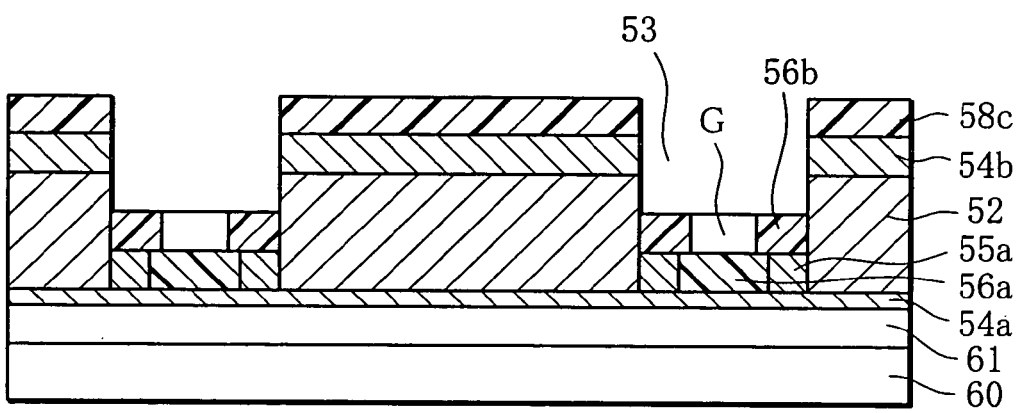
FIG. 26 is a cross-section showing a ninth step in the fabrication of the GaN-based FET of FIG. 16.

Then, as illustrated in FIG. 26, the remaining mask 58c is removed by etching to the same level as the gate electrode G in the groove 53, leaving the mask 58c on other regions than the groove 53. Consequently, the insulating layer 56b is interposed between the channel portion 52 and the gate electrode G.

Figure 27:
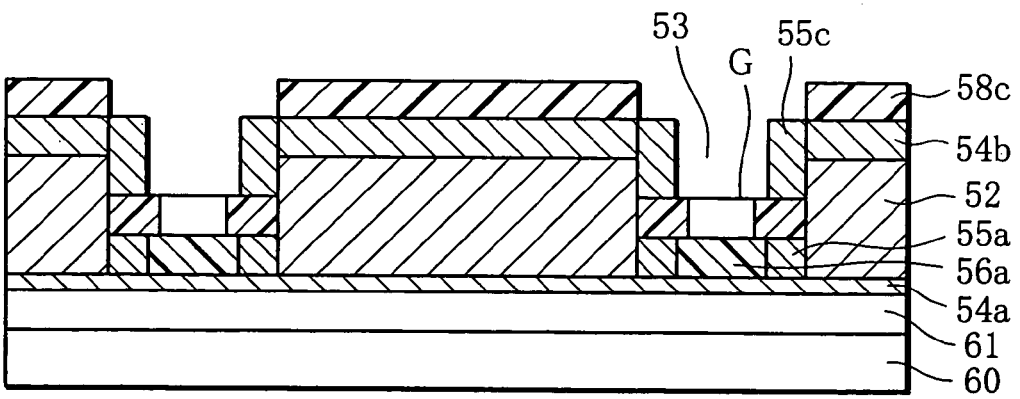
FIG. 27 is a cross-section showing a tenth step in the fabrication of the GaN-based FET of FIG. 16.

As illustrated in FIG. 27, an AlGaN layer 55c is deposited again by epitaxial growth in the groove 53 excluding a surface of the gate electrode G, and the electron supply layer 55b is formed on the insulating layer 56b so as to be attached to the side wall of the channel portion 52 and to an end face of the contact layer 54b.

Figure 28:
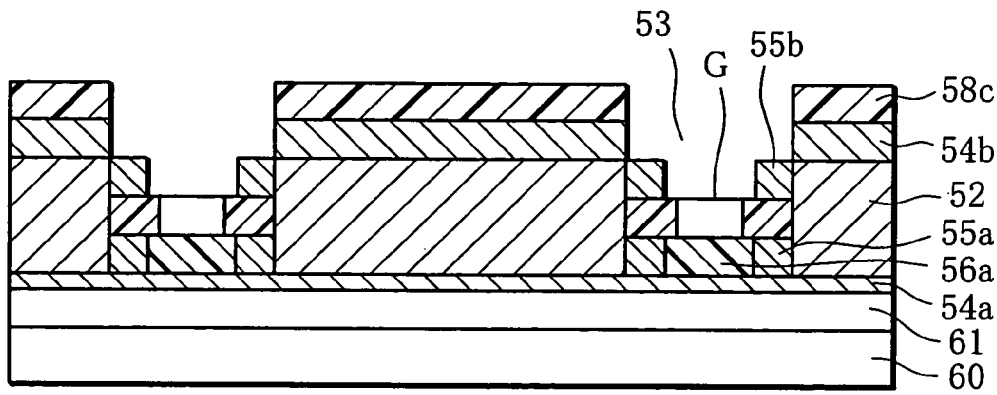
FIG. 28 is a cross-section showing an eleventh step in the fabrication of the GaN-based FET of FIG. 16.

As illustrated in FIG. 28, the AlGaN layer 55c is etched down to the same level as an upper end of the channel portion 52 (opening edge of the groove 53 of the channel portion), to thereby form the electron supply layer 55b attached onto the insulating layer 56b and onto the side wall of the channel portion 52. However, the process of etching the AlGaN layer 55c can be skipped to use the AlGaN layer 55c as the electron supply layer 55b without change.

Figure 29:
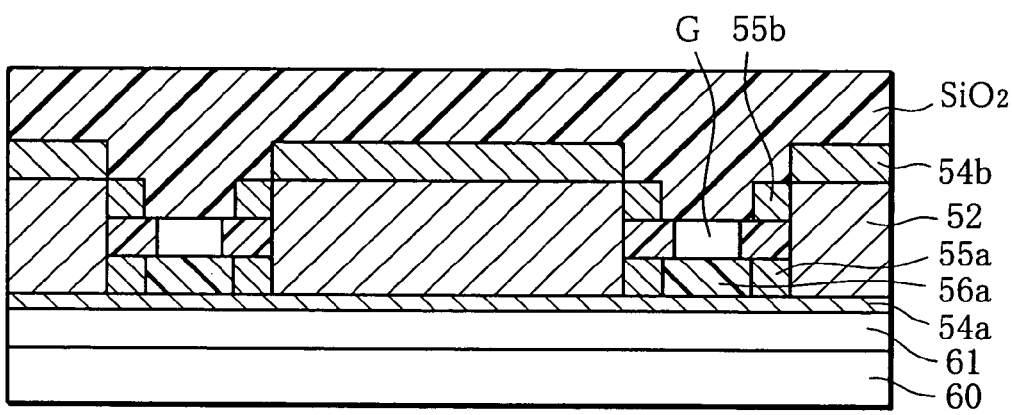
FIG. 29 is a cross-section showing a twelfth step in the fabrication of the GaN-based FET of FIG. 16.

As illustrated in FIG. 29, $SiO_2$ is evaporated across the entire surface.

Figure 30:
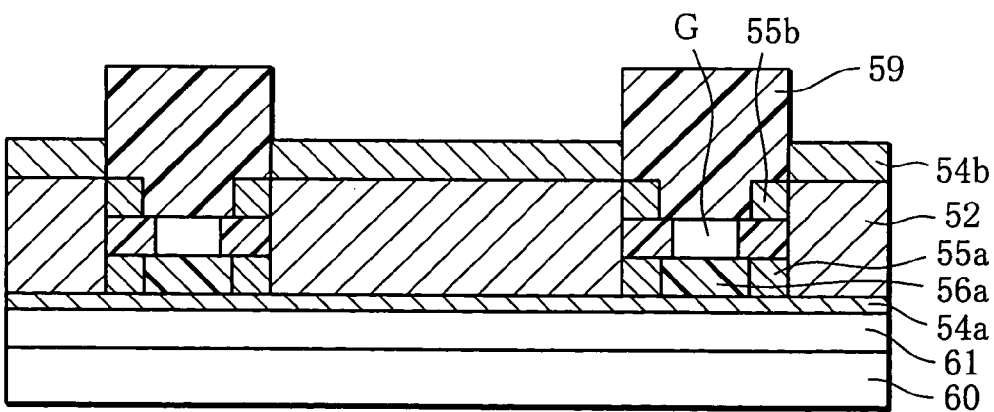
FIG. 30 is a cross-section showing a thirteenth step in the fabrication of the GaN-based FET of FIG. 16.

Subsequently, as illustrated in FIG. 30, $SiO_2$ is patterned on the groove 53 to form a protection layer 59.

Figure 31:
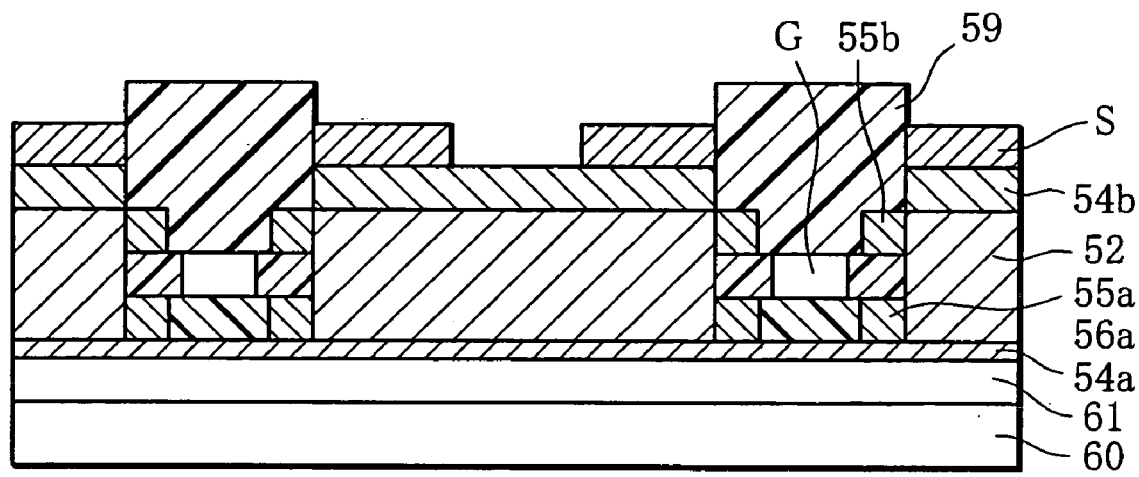
FIG. 31 is a cross-section showing a fourteenth step in the fabrication of the GaN-based FET of FIG. 16.

Thereafter, electrode materials, such as Al/Ti/Au, are overlaid in the order named on the contact layer 54b adjacently to the electron supply layer 55b to form a source electrode S, as shown in FIG. 31.

The resultant layers are turned upside down so that the source electrode is located below, and the substrate for growth 60 and the buffer layer 61 are polished. Then, a drain electrode D is formed in the same manner as the source electrode to obtain the GaN-based FET ($E_C$) shown in FIG. 17. In the GaN-based FET ($E_C$) of FIG. 17, the source electrode S can be arranged under the channel portion 52, and the drain electrode D above the channel portion 52.

Figure 32:
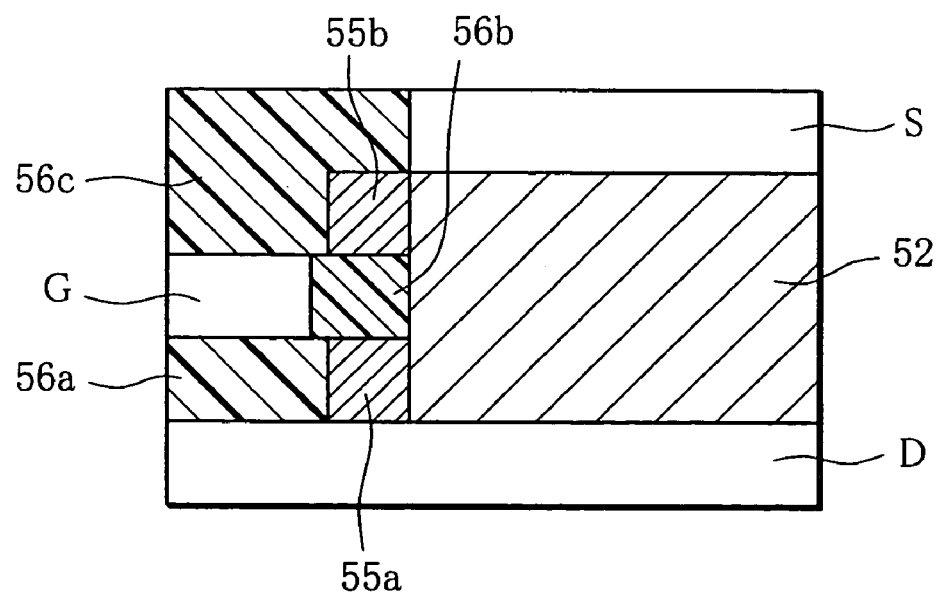
FIG. 32 is a cross-section showing a second embodiment of the GaN-based FET according to the present invention of type B.
Figure 33:
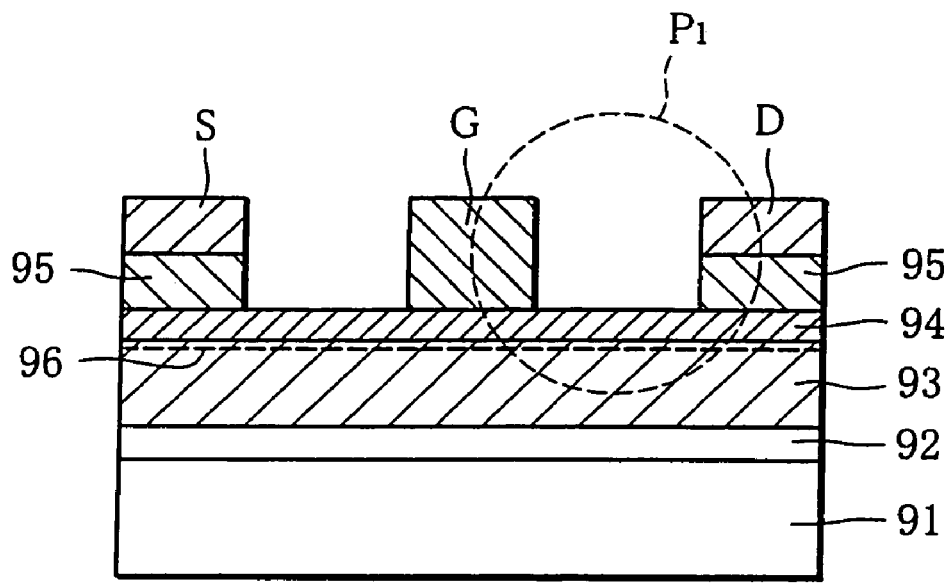
FIG. 33 is a cross-section showing a conventional GaN-based HEMT configuration.
Figure 34:
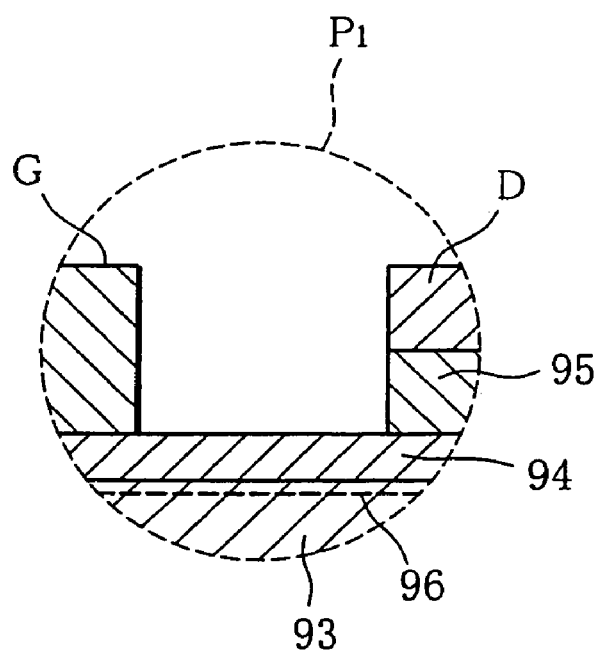
FIG. 34 is a partial enlarged view of FIG. 33.

As illustrated in FIG. 32, the GaN-based FET can have only one HEMT configuration. In this case, the FET is miniature ultrathin semiconductor device.

Embodiment 1

The GaN-based FET ($E_A$) shown in FIG. 1 was fabricated in the following manner.

First, as illustrated in FIG. 3, the GaN layer (buffer layer) 12 having a thickness of 50 nm was formed on the sapphire substrate 11 at a growth temperature of 700° C. through the GSMBE method by using nitrogen radical ($3\times10^{-6}$ Torr) and metal Ga ($5\times10^{-7}$ Torr). Furthermore, the p-GaN layer 13 (channel layer: carrier concentration is $5\times10^{18}$ cm$^{-3}$) having a thickness of 2 µm was formed thereon at a growth temperature of 850° C. by using metal Ga ($5\times10^{-7}$ Torr), ammonia ($5\times10^{-5}$ Torr) and metal Mg ($5\times10^{-9}$ Torr). Subsequently, the undoped $Al_{0.2}Ga_{0.8}N$ layer (electron supply layer) 14 having a thickness of 30 nm was formed thereon at a growth temperature of 850° C. by using metal Al ($1\times10^{-7}$ Torr), metal Ga ($3\times10^{-7}$ Torr) and ammonia ($5\times10^{-5}$ Torr).

The p-GaN has bandgap energy of 3.4 eV, and the undoped $Al_{0.2}Ga_{0.8}N$ has bandgap energy of 3.94 eV.

As illustrated in FIG. 4, the surface was etched using plasma of $CH_3/H_2/Ar$ mixed gas to remove a region of the electron supply layer 14, in which the gate portion would be disposed, to thereby expose the surface 13a corresponding to the p-GaN layer 13. Thereafter, the $SiO_2$ film 15 having a thickness of 50 nm was formed on the entire surface by the heat CVD method. The $SiO_2$ film 15 and the electron supply layer 14 were etch-removed in regions where the source and drain electrodes would be formed, as illustrated in FIG. 5.

Thereafter, as illustrated in FIG. 6, the n-GaN layer 16 (contact layer: Si doping concentration $3\times10^{19}$ cm$^{-3}$) having a thickness of 100 nm was formed in regions where the channel layer 13 was exposed, by using metal Ga ($3\times10^{-7}$ Torr), ammonia ($5\times10^{-5}$ Torr) and metal Si ($5\times10^{-9}$ Torr) through the GSMBE method. The n-GaN has bandgap energy of 3.4 eV.

Lastly, the gate electrode G made of Ta—Si was formed on the $SiO_2$ film 15, and the source electrode S and the drain electrode D made of Ta—Si/Au were arranged on the contact layer 16, by sputter deposition, thereby fabrication the GaN-based FET ($E_A$) shown in FIG. 1 was obtained.

According to examination as to current-voltage characteristics of the GaN-based FET ($E_A$), breakdown voltage between the source and the drain was 650 V. Furthermore, at the point of applying the gate bias voltage of +1 V or more, the current started to flow between the source and the drain, and the source-drain current (Ids) reached 60 A when the gate bias voltage was +5 V. The ON resistance of the GaN-based FET (A) was as extremely small as 10 mΩ·cm$^2$ at a breakdown voltage of 600 V.

Embodiment 2

The GaN-based FET ($E_C$) shown in FIG. 17 was fabricated as described below.

As illustrated in FIG. 18, the GaN layer (buffer layer) 61 having a thickness of 50 nm was formed at a growth temperature of 700° C. on the sapphire substrate 60 through the GSMBE method by using nitrogen radical ($3\times10^{-6}$ Torr) and metal Ga ($5\times10^{-7}$ Torr). Furthermore, the n-GaN layer (contact layer) 54a having a thickness of 30 nm was formed thereon at a growth temperature of 850° C.

On the contact layer 54a, the p-GaN layer 52c (channel layer: carrier concentration is $5\times10^{18}$/cm$^3$) having a thickness of 2 µm was formed at a growth temperature of 850° C. by using metal Ga ($5\times10^{-7}$ Torr), ammonia ($5\times10^{-5}$ Torr) and metal Mg ($5\times10^{-9}$ Torr). The n-GaN layer (contact layer) 54b having a thickness of 30 nm was formed thereon at a growth temperature of 850° C. by using metal Al ($1\times10^{-7}$ Torr), metal Ga ($3\times10^{-7}$ Torr) and ammonia ($5\times10^{-5}$ Torr).

Subsequently, as illustrated in FIG. 19, the mask 58a made of $SiO_2$ was patterned on the surface of the channel layer 52c. By using ECR plasma, the entire patterned regions of the contact layer 54b and the channel layer 52c were subjected to a dry etching process through a thickness of 2 µm until the contact layer 54a was exposed, resulting in the groove 53 having a width of 2,060 nm.

As illustrated in FIG. 20, the mask 58b made of $SiO_2$ was overlaid again on the entire surface to a thickness of 100 nm.

As illustrated in FIG. 21, the mask 58b was patterned to be partially removed, thereby forming at the bottom of the groove 53 the insulating layer 56a having a thickness of 100 nm by measure from the bottom of the groove, the insulating layer 56a being located 30 nm away from the side surfaces of the groove 53.

Thereafter, as illustrated in FIG. 22, AlGaN having greater bandgap energy than the p-GaN making up the channel portion 52 was deposited by the epitaxial growth on region where the groove 53 and the insulating layer 56a are separated from each other at a distance of 30 nm, to a thickness of 100 nm by measure from the bottom of the groove, to thereby form the electron supply layer 55a.

Thereafter, as illustrated in FIG. 23, the mask 58c made of $SiO_2$ was deposited on the entire surface to a thickness of 50 nm.

Next, as illustrated in FIG. 24, the mask 58c at the bottom of the groove 53 was etched by a thickness of 50 nm which had been deposited in the step of FIG. 23 to expose the insulating layer 56a again. This resulted in the groove 53 in which the electron supply layer 55a was surmounted by the insulating mask 58c, and the side walls of the channel portion 52 were covered by $SiO_2$, except for the regions to which the electron supply layer 55a was attached, the $SiO_2$ having a horizontal thickness of 50 nm by measure from the side walls of the channel portion 52.

As illustrated in FIG. 25, mask was applied to the entire surface, except for the groove 53, and Pt as a gate electrode material was evaporated on the insulating layer 56a to have a vertical thickness of 200 nm, to thereby form the gate electrode G.

Subsequently, as illustrated in FIG. 26, the remaining mask 58c was removed by etching till having the same height as the gate electrode G in the groove 53, leaving the mask 58c remained in other regions than the groove 53, resulting in the insulating layer 56b sandwiched between the channel portion 52 and the gate electrode G.

Then, as illustrated in FIG. 27, AlGaN layer 55c was again deposited by epitaxial growth to a horizontal thickness of 30 nm from the side wall of the channel layer 52 and the end face of the contact layer 54b, leaving the surface of the gate electrode G.

Furthermore, as illustrated in FIG. 28, the AlGaN layer 55c was etched down to the upper end of the channel layer 52 (that is, the opening edge of the groove 53 provided to the channel layer 52), thereby forming the electron supply layer 55b that was located on the insulating layer 56b and attached to the side wall of the channel layer 52.

In the next place, as illustrated in FIG. 29, $SiO_2$ was evaporated over the entire surface so as to fill in the groove 53.

As illustrated in FIG. 30, a patterning process was carried out, leaving $SiO_2$ in the groove 53 including the electron supply layer 56b, to form the protection layer 59, to thereby show the contact layer 54b.

Next, as illustrated in FIG. 31, electrode materials, such as Al/Ti/Au, were deposited in the order named on the contact layer 54b to a thickness of 400 nm adjacently to the electron supply layer 55b to form the source electrode S.

The resultant layers were turned upside down so that the source electrode was located below, and the substrate for growth 60 and the buffer layer 61 were polished. The drain electrode D was formed to a thickness of 400 nm in the same manner as the source electrode, thereby obtaining the GaN-based FET ($E_C$) shown in FIG. 17.

As a consequence, a normally-off FET having a vertical configuration, in which current did not flow between the source and the drain at a gate bias (Vgs)=0 V, was achieved. Maximum operating current was 100 A, and a breakdown voltage was 600 V.

INDUSTRIAL APPLICABILITY

As described above, the GaN-based field effect transistor according to the present invention has an extremely small ON resistance during operation, is capable of a large-current operation, and moreover is a normally-off type. Therefore, there is the expectation that the transistor will be utilized not only as a switching device for a power source but also as an HEMT, a power device of a microwave band or millimeter wave, and furthermore an inverter and a converter serving as a device for transmitting and converting electric energy in future.

The invention claimed is:

1. A GaN-based field effect transistor comprising:
a source electrode and a drain electrode;
a channel portion made of a first GaN-based semiconducting material that is an i-GaN-based semiconducting material or a p-GaN-based semiconducting material, the channel portion being so formed as to be electrically connected to said source and drain electrodes;
first and second electron supply portions made of second GaN-based semiconducting material having greater bandgap energy than said first GaN-based semiconducting material, the first and second electron supply portions being joined to said channel portion and located separately from each other;
contact layers made of a third GaN-based semiconducting material having bandgap energy smaller than or equal to said first GaN-based semiconducting material, said contacting layers being located between said channel portion and the source electrode and between said channel portion and the drain electrode, respectively;
an insulating layer overlaid on a surface of said channel portion, which spreads between said first and second electron supply portions; and
a gate electrode disposed on said insulating layer.

2. The GaN-based field effect transistor according to claim 1, wherein a material for said insulating layer is $SiO_2$, AlN, $Al_2O_3$, $Ga_2O_3$, $TaO_x$, $SiN_x$ or SiON.

3. The GaN-based field effect transistor according to claim 1, wherein the embedded portions of said contact layers form undercut portions with respect to said electron supply portions.

4. The GaN-based field effect transistor according to claim 1, having a layer in between said insulating layer and said channel portion, the layer being made of a fourth GaN-based semiconducting material that has greater bandgap energy than the first GaN-based semiconducting material making up said channel portion and has smaller bandgap energy than the second GaN-based semiconducting material making up said electron supply layers.

5. The GaN-based field effect transistor according to claim 1, wherein said channel portion is a channel layer formed on a substrate; said source electrode and said drain electrode are both arranged on the surface of said channel layer; and said first and second electron supply portions are disposed between the source electrode and the drain electrode on the surface of said channel layer.

6. The GaN-based field effect transistor according to claim 1, wherein said channel portion is formed in the shape of a ridge; said source electrode and said drain electrode are arranged on an upper surface and lower surface of the ridge-shaped channel portion, respectively; and said electron supply layers and the insulating layer are formed on a side wall surface of said channel portion.

7. The GaN-based field effect transistor according to claim 6, comprising contact layers made of a third GaN-based semiconducting material that has bandgap energy smaller than or equal to said first GaN-based semiconducting material, the contact layers being located between said channel portion and the source electrode and between said channel portion and the drain electrode, respectively.

8. The GaN-based field effect transistor according to claim 7, wherein said field effect transistor is provided with a plurality of ridge-shaped channel portions aligned in a line, and two adjacent channel portions of the plurality of ridge-shaped channel portions are connected to each other through the contact layer.

9. The GaN-based field transistor according to claim 8, wherein the drain electrode provided in lower surfaces of said plurality of ridge-shaped channel portions is integrally formed.

10. A GaN-based field effect transistor comprising:
a source electrode and a drain electrode;
a channel portion made of a first GaN-based semiconducting material that is a p-GaN-based semiconducting material, the channel portion being so formed as to be electrically connected to said source and drain electrodes;
first and second electron supply portions made of a second GaN-based semiconducting material that is an undoped GaN-based semiconducting material, having greater bandgap energy than said first GaN-based semiconducting material, the first and second electron supply portions being joined to said channel portion and located separately from each other, wherein said p-GaN-based semiconducting material is denoted by $M_A/M_B$, p-GaN/AlGaN, p-GaN/AlInGaN, p-InGaN/GaN, p-GaNAs/GaN, p-GaInNAsP/GaN, p-GaInNP/GaN, p-GaNP/GaN, p-GaN/AlGaInNAsP or p-AlInGaN/AlGaN;

an insulating layer overlaid on a surface of said channel portion, which spreads between said first and second electron supply portions; and a gate electrode disposed on said insulating layer.

11. The GaN-based field effect transistor according to claim 10, wherein a material for said insulating layer is $SiO_2$, AlN, $Al_2O_3$, $Ga_2O_3$, $TaO_x$, $SiN_x$ or SIGN.

12. The GaN-based field effect transistor according to claim 10, wherein the embedded portions of said contact layers form undercut portions with respect to said electron supply portions.

13. The GaN-based field effect transistor according to claim 10, wherein said channel portion is a channel layer formed on a substrate; said source electrode and said drain electrode are both arranged on the surface of said channel layer; and said first and second electron supply portions are disposed between the source electrode and the drain electrode on-the surface of said channel layer.

14. The GaN-based field effect transistor according to claim 10, wherein said channel portion is formed in the shape of a ridge; said source electrode and said drain electrode are arranged on an upper surface and lower surface of the ridge-shaped channel portion, respectively; and said electron supply layers and the insulating layer are formed on a side wall surface of said channel portion.

* * * * *